(12) United States Patent
Ohtani

(10) Patent No.: US 6,813,188 B2
(45) Date of Patent: Nov. 2, 2004

(54) NON-VOLATILE SEMICONDUCTOR MEMORY DEVICE HAVING A MEMORY CELL WHICH STABLY RETAINS INFORMATION

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/334,004

(22) Filed: Dec. 31, 2002

(65) Prior Publication Data

US 2004/0027859 A1 Feb. 12, 2004

(30) Foreign Application Priority Data

Aug. 8, 2002 (JP) ........................................ 2002-231523

(51) Int. Cl.$^7$ .............................................. G11C 16/04
(52) U.S. Cl. ............................ 365/185.18; 365/185.23; 365/185.28
(58) Field of Search ....................... 365/185.18, 185.23, 365/185.28, 185.02, 189.09

(56) References Cited

U.S. PATENT DOCUMENTS 5,307,305 A * 4/1994 Takasu ........................ 365/145
5,999,444 A * 12/1999 Fujiwara et al. ......... 365/185.02
6,272,037 B1 * 8/2001 Miyamoto ................... 365/145

FOREIGN PATENT DOCUMENTS

| JP | 8-306808 | 11/1996 |
| JP | 2000-222893 | 8/2000 |

* cited by examiner

Primary Examiner—Gene Auduong
(74) Attorney, Agent, or Firm—Burns, Doane, Swecker & Mathis, L.L.P.

(57) ABSTRACT

In a non-volatile semiconductor memory device, three word line voltage circuits generating different voltages are provided. A voltage selecting circuit pre-selecting one voltage from the three different voltages is provided. In an ONO film in which lower silicon oxide film is formed thinner than upper silicon oxide film, word line voltage generating circuit is pre-selected, and in a write operation a voltage of 7V lower than the normal voltage of 9V is applied. In ONO film in which upper silicon oxide film is formed thinner than lower silicon oxide film, word line voltage generating circuit is pre-selected, and in a write operation a voltage of 11V higher than the normal voltage of 9V is applied. Thus, the non-volatile semiconductor memory device capable of retaining charges as information stably is attained.

5 Claims, 14 Drawing Sheets

NON-VOLATILE SEMICONDUCTOR MEMORY DEVICE HAVING A MEMORY CELL WHICH STABLY RETAINS INFORMATION

BACKGROUND OF THE INVENTION

1. Field of the Invention

The present invention relates to a non-volatile semiconductor memory device, and specifically, to a non-volatile semiconductor memory device with memory cells having a layered film of an oxide film, a nitride film, and another oxide film (hereinafter referred to as an "ONO film").

2. Description of the Background Art

As one type of an MONOS (Metal OxyNitride Oxide Semiconductor) non-volatile semiconductor memory device which itself is one implementation of a non-volatile semiconductor memory device, an NROM (Nitrided Read Only Memory) 120 as shown in FIG. 13 may be found which can handle 2 bits of information per one memory cell 110.

In each of the memory cells, for example as shown in FIG. 14, an ONO film 105, formed with silicon oxide films 105a and 105c, and a silicon nitride film 105b, is formed on a semiconductor substrate 101. The ONO film 105 has a floating gate structure, and silicon nitride film 105b among the three layered films forming ONO film 105 serves as the floating gate.

In one region and the other region of semiconductor substrate 101 respectively positioned at opposing sides of ONO film 105, a pair of impurity regions 103a and 103b are formed as source/drain regions. On ONO film 105, a control gate electrode 107 of polysilicon film or polycide structure, for example, is formed.

Information is written by injecting channel hot electrons (hereinafter simply referred to as "electrons") into two portions in silicon nitride film 105b separately, which are respectively positioned at the side near one impurity region 103a and at the side near the other impurity region 103b, of the pair of impurity regions 103a and 103b. Thus, 2 bits of information can be handled per one cell.

Next, an information write operation of the non-volatile semiconductor memory device will be described. First, as shown in FIG. 14, no information is written in the memory cell in the initial state, and a voltage of 0V is applied to control gate electrode 107 of the memory cell, a pair of impurity regions 103a and 103b, and semiconductor substrate 101, respectively.

Next, as shown in FIG. 13, a word line WL1 is selected by a row decoder 115 and control gate electrode 107 of memory cell 110 is connected to a word line voltage generating circuit 111. Bit lines BL2 and BL3 are selected by a column decoder 117.

Thus, as shown in FIG. 15, a prescribed voltage of 9V is applied to control gate electrode 107. A voltage of 0V is applied to impurity region 103a, and a voltage of 5V is applied to impurity region 103b.

At this time, electrons flow from impurity region 103a toward impurity region 103b, and electrons 121 which turned to be the channel hot electrons near impurity region 103b are injected into silicon nitride film 105b of ONO film 105.

Thereafter, as shown in FIG. 16, a voltage of 0V is applied to control gate electrode 107, a pair of impurity regions 103a and 103b, and semiconductor substrate 101, respectively.

In the state shown in FIG. 16, electrons 121 injected into the portion near impurity region 103b in silicon nitride film 105b will not shift from its location toward impurity region 103a. Thus, 1 bit of information is written into one memory cell 110.

Next, an operation for writing further 1 bit of information into that one memory cell 110 will be described. First, from the state shown in FIG. 17 in which 1 bit of information is written (the same state shown in FIG. 16), bit lines BL2 and BL3 of memory cell 110 are selected by column decoder 117 as described above. Then, by a row decoder 115, control gate electrode 107 is connected to word line voltage generating circuit 111.

Thus, as shown in FIG. 18, the prescribed voltage of 9V is applied to control gate electrode 107. A voltage of 5V is applied to impurity region 103a, and a voltage of 0V is applied to impurity region 103b.

At this time, electrons flow from impurity region 103b toward impurity region 103a, and electrons 121 which turned to be the channel hot electrons near impurity region 103a are injected into silicon nitride film 105b of ONO film 105. Thereafter, as shown in FIG. 19, a voltage of 0V is applied to control gate electrode 107, a pair of impurity regions 103a and 103b, and semiconductor substrate 101, respectively.

In the state shown in FIG. 19, electrons 121 injected into the portion near impurity region 103a in silicon nitride film 105b will not shift from its location toward impurity region 103b. Thus, 2 bits of information is written into one memory cell 110 of the non-volatile semiconductor memory device.

In the conventional semiconductor memory device described above, however, following problems exist. Generally, each process of manufacturing semiconductor devices involves manufacturing variations. When forming ONO film 105 of the non-volatile semiconductor memory device described above, silicon oxide films 105a and 105c vertically sandwiching silicon nitride film 105b are normally formed such that both of the films have the same thickness.

On the other hand, when films vary in thickness at steps of forming the silicon oxide films, silicon oxide film 105a of the lower layer may be formed thinner than silicon oxide film 105c of the upper layer, for example as shown in FIG. 20. On the contrary, silicon oxide film 105c of the upper layer may be formed thinner than silicon oxide film 105a of the lower layer.

As shown in FIG. 22, when a write operation is performed to a non-volatile semiconductor memory device having ONO film 105 in which lower silicon oxide film 105a is formed thinner than upper silicon oxide film 105c, electrons 121 turned to be the channel hot electrons near impurity region 103b are injected into silicon nitride film 105b in a portion near upper silicon oxide film 105c, or injected into a portion of silicon oxide film 105c.

Thus, as shown in FIG. 23, electrons 121 are stored (trapped) in that portion.

As shown in FIG. 24, when a write operation is performed to a non-volatile semiconductor memory device having ONO film 105 in which upper silicon oxide film 105c is formed thinner than lower silicon oxide film 105a, electrons 121 turned to be the channel hot electrons near impurity region 103b are injected into silicon nitride film 105b in a portion near lower silicon oxide film 105a, or injected into a portion of silicon oxide film 105a.

Thus, as shown in FIG. 25, electrons 121 are stored (trapped) in that portion.

In such states, electrons 121 can not be retained stably in silicon nitride film 105b, and electrons 121 may leak from the portions near silicon oxide films 105a and 105c, for example after a long time period. Further, electrons 121 injected into one side of silicon nitride film 105b may shift toward the other side.

As a result, the memory characteristics are degraded and the reliability of the non-volatile semiconductor device is impaired.

SUMMARY OF THE INVENTION

The present invention is contemplated to solve the above mentioned problems, and the object thereof is to provide a non-volatile semiconductor memory device that retains charges as information stably.

The semiconductor memory device according to the present invention includes memory cells and voltage applying circuit. A memory cell includes a pair of impurity regions formed spaced apart from each other on a main surface of a semiconductor substrate, a first insulating film formed on a region between the pair of impurity regions on the semiconductor substrate, a second insulating film formed on the first insulating film for storing charges as information, a third insulating film formed on the second insulating film, and an electrode portion formed on the third insulating film for controlling shift of charges relative to the second insulating film. The voltage applying circuit supplies to the electrode a prescribed voltage for storing charges, in an information write operation, approximately at the center of the second insulating film in the direction of thickness. The voltage applying circuit includes a voltage selecting circuit pre-selecting the prescribed voltage depending on the relationship between a thickness of the first insulating film and that of the third insulating film.

According to this structure, when the thickness of the first and third insulating films varies, or intentional modification of the relationship between the thickness of the first insulating film and that of the third insulating film is desired, a prescribed voltage, which is to be applied to the electrode portion for trapping charges as information in approximately at the center of the second insulating film in the direction of thickness, is pre-selected by the voltage selecting circuit, from a plurality of different voltages, depending on the relationship of the thickness. Thus, retaining characteristics of information stored by write operation is stabilized, and thus the reliability of the non-volatile semiconductor memory device is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
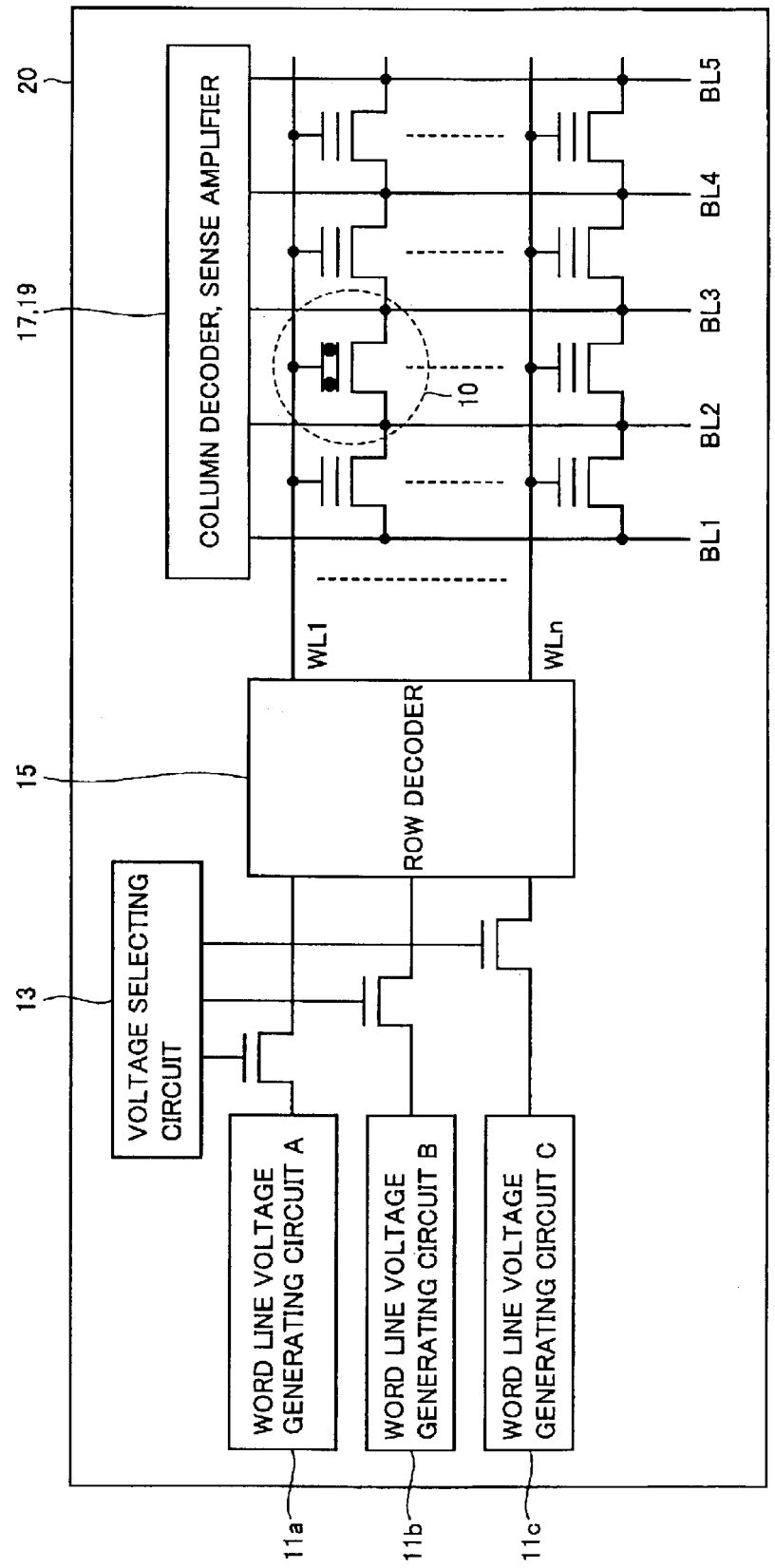
FIG. 1 is a block diagram of non-volatile semiconductor memory device according to a first embodiment of the present invention.

A non-volatile semiconductor memory device according to a first embodiment of the present invention will be described. As shown in FIG. 1, the non-volatile semiconductor memory device includes memory cells, a row decoder 15 and a column decoder 17 for selecting input/output of information to/from a particular memory cell 10, a sense amplifier 19 for amplifying input/output of information, and word line generating circuits 11a to 11c generating voltage to be applied to word lines.

Specifically, in this non-volatile semiconductor memory device, three word line voltage generating circuits A, B, C (11a to 11c) generating different voltages are provided as the word line voltage generating circuits. Additionally, a voltage selecting circuit 13 is provided for selecting one appropriate voltage from these three different voltages depending on the thickness of two silicon oxide films forming the ONO film of memory cell 10.

Figure 2:
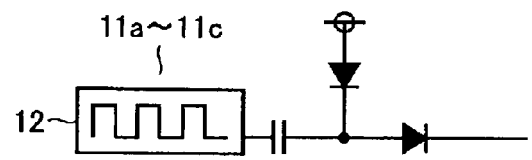
FIG. 2 shows an arrangement of a word line voltage generating circuit shown in FIG. 1 according to the first embodiment.

As shown in FIG. 2, each of word line voltage generating circuits 11a to 11c is formed with a prescribed boosting circuit, which has a pulse generating circuit 12 or a diode and the like. Different voltages are generated by changing the frequency of pulse generating circuit 12 or changing the size of the diode.

In the non-volatile semiconductor memory device, voltages of 7V, 9V and 11V are provided as specific different three voltages. Normally, two silicon oxide films forming ONO film are formed to have the same thickness, and in this case a voltage of 9V is selected.

Figure 3:
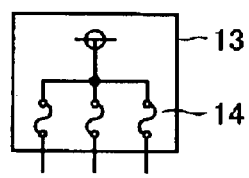
FIG. 3 shows an arrangement of a voltage selecting circuit shown in FIG. 1 according to the first embodiment.

On the other hand, when the thickness of silicon oxide films varies, a voltage of 11V or 7V is selected depending on the thickness of the silicon oxide film. Each of word line voltage selecting circuits 11a to 11c is pre-selected by voltage selecting circuit 13. This voltage selecting circuit 13 is a programmable circuit, and formed, for example, with prescribed fuse elements 14 as shown in FIG. 3.

By disconnecting particular fuse elements among the prescribed fuse elements 14, one appropriate word line voltage generating circuit 11a to 11c is selected from three word line voltage generating circuits 11a to 11c.

Figure 4:
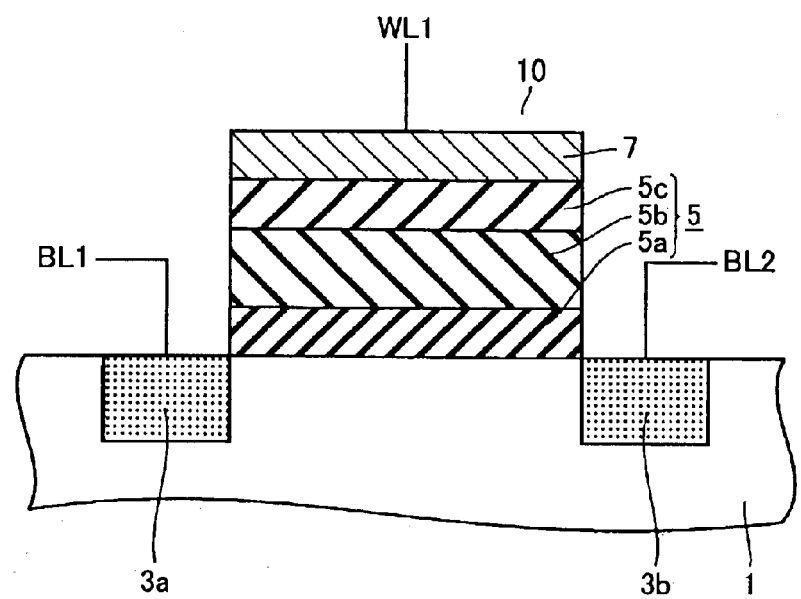
FIG. 4 is a cross-sectional view showing the structure of a memory cell shown in FIG. 1.

Next, a specific structure of one memory cell 10 will be described. As shown in FIG. 4, ONO film 5, formed with silicon oxide films 5a and 5c and silicon nitride films 5b, is formed on semiconductor substrate 1. ONO film 5 has a floating gate structure, and silicon nitride film 5b serves as the floating gate.

In one region and the other region of semiconductor substrate 1 at opposing sides of ONO film 5, a pair of impurity regions 3a and 3b are formed as source/drain regions. On ONO film 5, a control gate electrode 7 of polysilicon film or polycide structure, for example, is formed.

As described above, silicon oxide films 5a and 5c forming ONO film 5 are normally formed to have substantially the same thickness. In steps of forming silicon oxide films, however, the manufacture variations may occur.

Accordingly, in the following, a case in which variations in thickness of silicon oxide films occurs and a write operation in that case will be described. Note that for the thickness of silicon oxide films 5a and 5c in ONO film 5, reference can be made, for example, to the film thickness data of a monitor wafer deposited with the lot for production management. Additionally, it can also be known by measuring the thickness of a wafer actually deposited (a product wafer).

First, consider a non-volatile semiconductor memory device having ONO film 5 in which lower silicon oxide film 5a is formed thinner than upper silicon oxide film 5c.

In this case, the voltage to be applied to a word line connected to particular memory cell 10 is preferably 7V, which is lower than a normal voltage of 9V, and to this end, word line voltage generating circuit A (11a) is selected. The selection of word line voltage generating circuit A (11a) is performed by disconnecting two fuses among fuse elements 14 forming voltage selection circuit 13.

Thus, as shown in FIG. 1, for the non-volatile semiconductor memory device in which prescribed word line voltage generating circuit A (11a) is pre-selected, word line WL1 is selected by row decoder 15 and control gate electrode 7 of memory cell 10 is connected to word line voltage generating circuit A (11a). Additionally, bit lines BL2 and BL3 are selected by column decoder 17.

Figure 6:
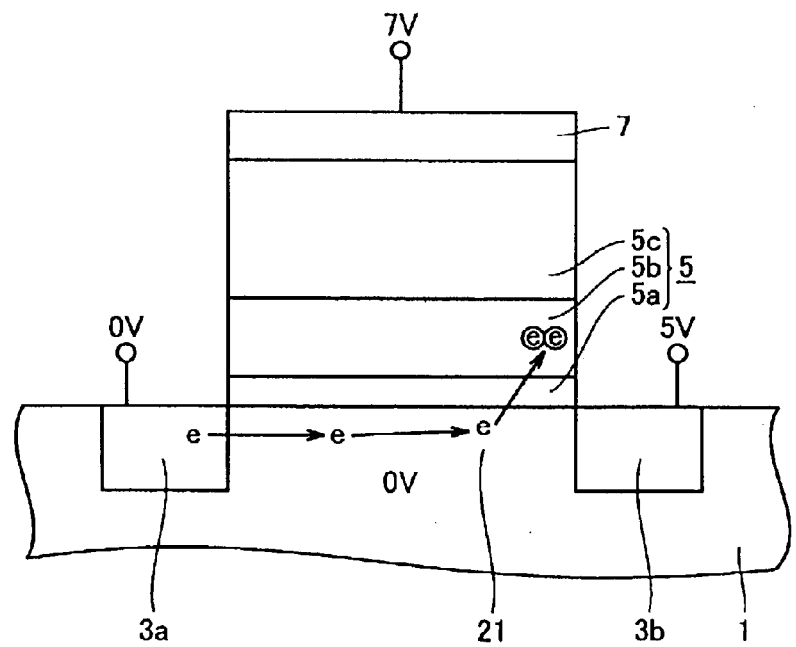
FIG. 6 is a first cross-sectional view representing a write operation of memory cell shown in FIG. 5 according to the first embodiment.

Thus, as shown in FIG. 6, a voltage of 7V is applied to control gate electrode 7. A voltage of 0V is applied to impurity region 3a and a voltage of 5V is applied to impurity region 3b.

At this time, electrons flow from impurity region 3a toward impurity region 3b, and electrons 21 turned to be the channel hot electrons near impurity region 3b are injected into silicon nitride film 5b in ONO film 5.

In this case, since the voltage (7V) lower than the normal voltage (9V) is applied to control gate electrode 7, the force by which electrons 21 are drawn to control gate electrode 7 is weakened.

Figure 7:
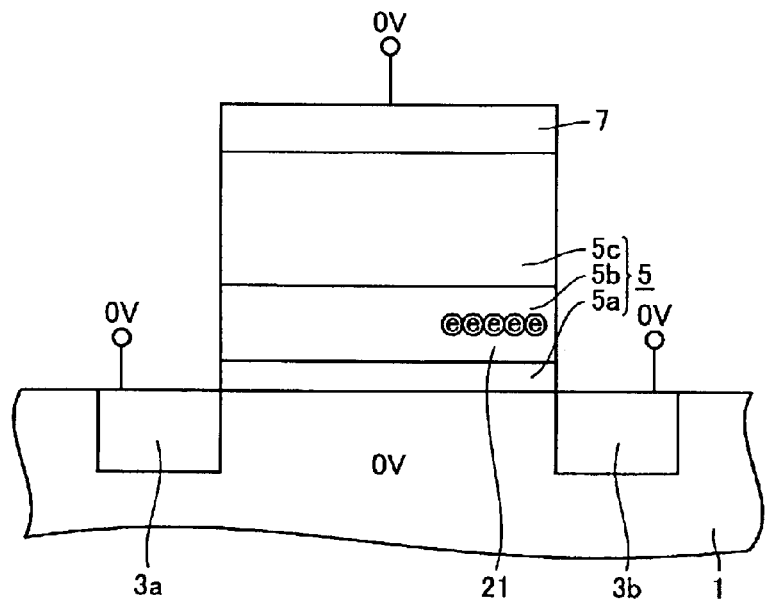
FIG. 7 is a second cross-sectional view representing a write operation of memory cell shown in FIG. 5 according to the first embodiment.

As such, compared to the case in which control gate electrode 7 is applied with the normal voltage of 9V, electrons 21 are less drawn toward control gate electrode 7 in silicon nitride film 5b. As a result, as shown in FIG. 7, electrons 21 are trapped approximately at the center of silicon nitride film 5b in the direction of thickness (vertical direction).

Thus, even when lower silicon oxide film 5a is formed thinner than upper silicon oxide film 5c in ONO film 5, electrons 21 as information are trapped and retained approximately at the center of silicon nitride film 5b in the direction of thickness.

Figure 8:
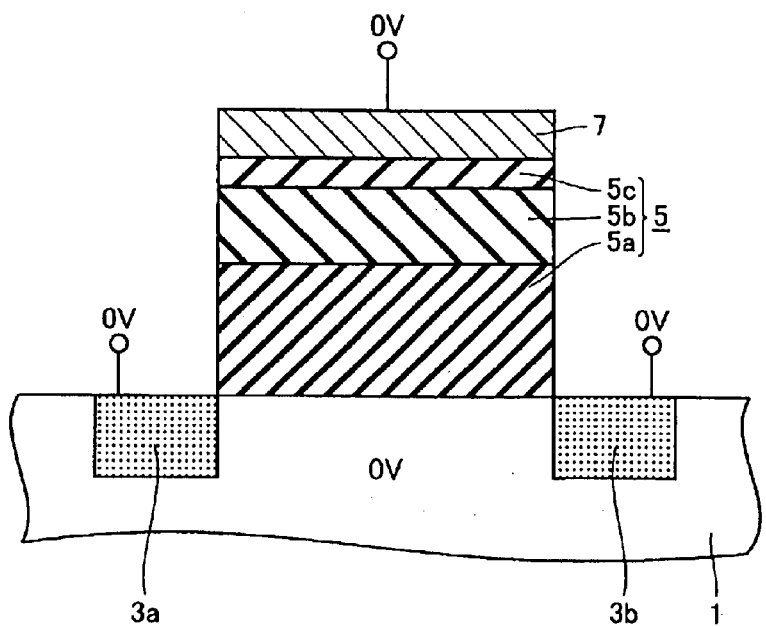
FIG. 8 is a cross-sectional view showing another implementation of memory cell structure according to the first embodiment.

Next, as shown in FIG. 8, consider a non-volatile semiconductor memory device having ONO film 5 in which upper silicon oxide film 5c is formed thinner than lower silicon oxide film 5a.

In this case, the voltage to be applied to a word line connected to particular memory cell 10 is preferably 11V, which is higher than the normal voltage of 9V, and to this end, word line voltage generating circuit C (11c) is selected. The selection of word line voltage generating circuit C (11c) is performed by disconnecting two fuses among fuse elements 14 forming voltage selection circuit 13.

Figure 9:
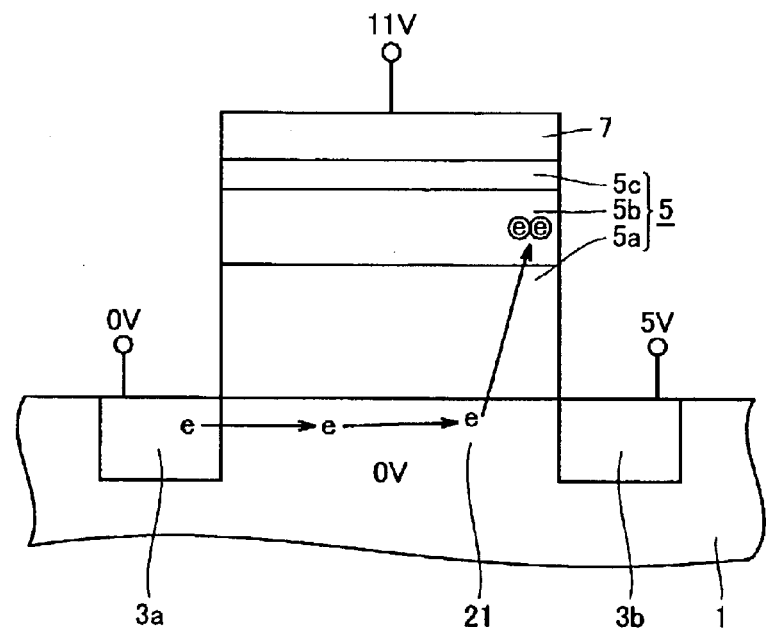
FIG. 9 is a first cross-sectional view representing a write operation of memory cell shown in FIG. 8 according to the first embodiment.

Thus, as shown in FIG. 9, for the non-volatile semiconductor memory device in which prescribed word line voltage generating circuit C (11c) is pre-selected, a voltage of 11V is applied to control gate electrode 7. A voltage of 0V is applied to impurity region 3a and a voltage of 5V is applied to impurity region 3b.

At this time, electrons flow from impurity region 3a toward impurity region 3b, and electrons 21 turned to be channel hot electrons near impurity region 3b are injected into silicon nitride film 5b in ONO film 5.

In this case, since the voltage (11V) higher than the normal voltage (9V) is applied to control gate electrode 7, the force by which electrons 21 are drawn to control gate electrode 7 is increased.

Figure 10:
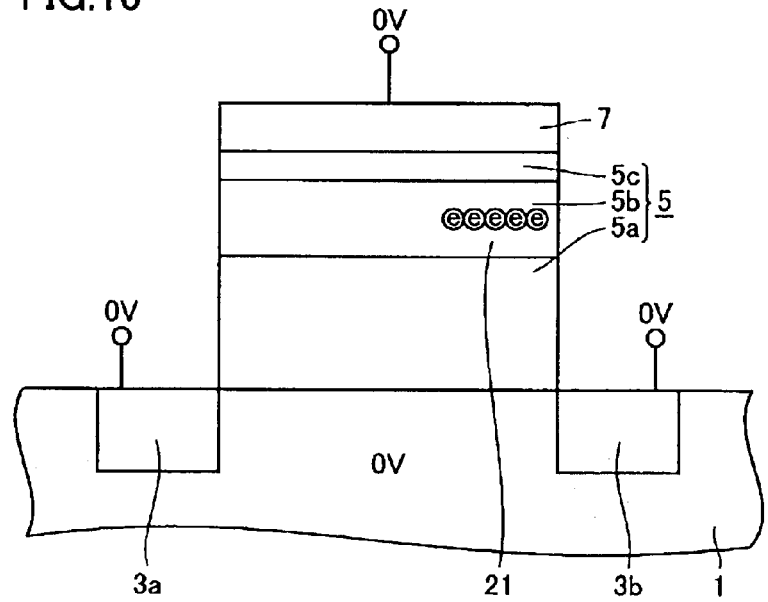
FIG. 10 is a second cross-sectional view representing a write operation of memory cell shown in FIG. 8 according to the first embodiment.

As such, compared to the case in which control gate electrode 7 is applied with the normal voltage of 9V, electrons 21 are positively drawn toward control gate electrode 7 in silicon nitride film 5b. As a result, as shown in FIG. 10, electrons 21 are trapped approximately at the center of silicon nitride film 5b in the direction of thickness.

Thus, even when upper silicon oxide film 5c is formed thinner than lower silicon oxide film 5a in ONO film 5, electrons 21 as information are trapped and retained approximately at the center of silicon nitride film 5b in the direction of thickness.

As described above, even when variations in the thickness of silicon oxide films 5a and 5c of ONO film 5 occurs, by pre-selecting the voltage to be applied to control gate 7 depending on the relationship between the thickness of the silicon oxide films, electrons as information can be trapped and retained, in a write operation, approximately at the center of silicon nitride film 5b in the direction of thickness.

As a result, electrons are stably retained in silicon nitride film 5b to attain stabilized storage characteristics, and thus reliability of the non-volatile semiconductor memory device is improved.

Second Embodiment

In the following, a non-volatile semiconductor memory device will be described, which enables more accurate control of the voltage to be applied to a word line.

Figure 11:
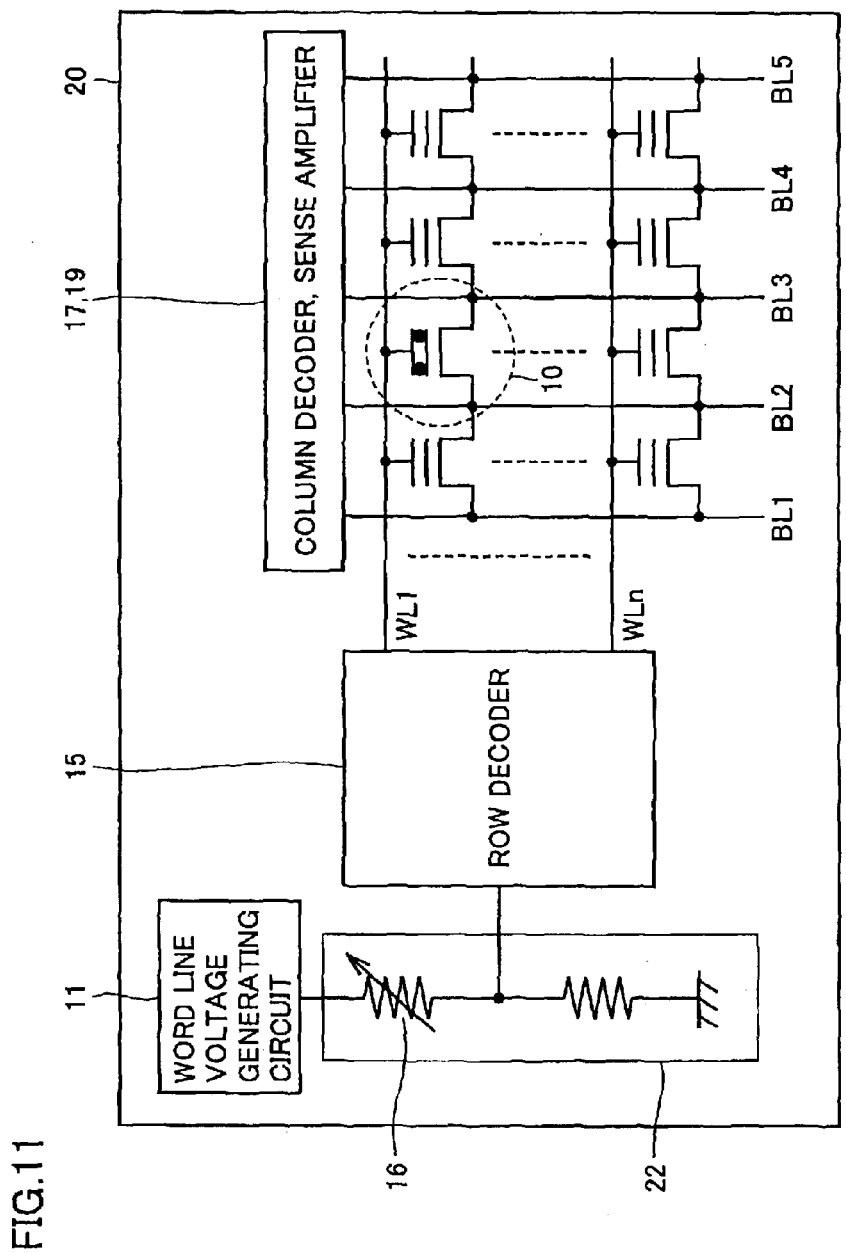
FIG. 11 is a block diagram of a non-volatile semiconductor memory device according to a second embodiment of the present invention.

As shown in FIG. 11, in the non-volatile semiconductor memory device, a word line voltage generating circuit 11 and a voltage dividing circuit 22 are provided, specifically as circuits for applying the prescribed voltage to a word line. Voltage dividing circuit 22 is formed with a prescribed resistor 16, and by dividing that resistor 16, the voltage generated by word line voltage generating circuit 11 is divided.

The rest of the arrangement of the circuit is the same as that of the non-volatile semiconductor memory device described above, and thus the same part is identified by the same reference number and the description thereof will not be repeated.

As shown in FIG. 11, voltage dividing circuit 22 is connected between word line voltage generating circuit 11 and row decoder 15. Word line voltage generating circuit 11 is arranged such that the highest voltage among the voltages to be applied to control gate electrode 7 is generated. The voltage generated at word line voltage generating circuit 11 is lowered to a prescribed voltage by voltage dividing circuit 22, and applied to control gate electrode of prescribed memory cell via row decoder 15.

Figure 12:
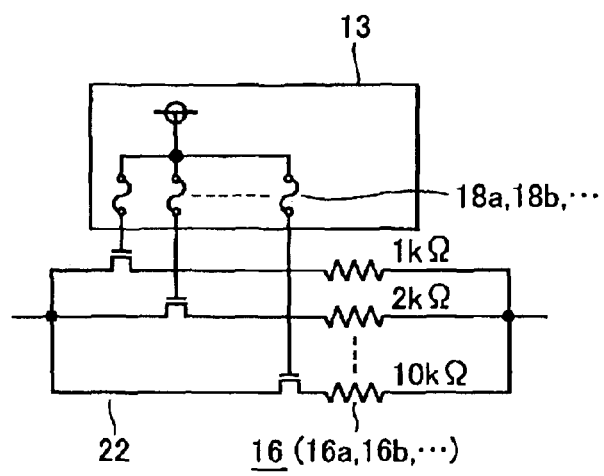
FIG. 12 shows an arrangement of a resistor circuit in FIG. 11.
Figure 13:
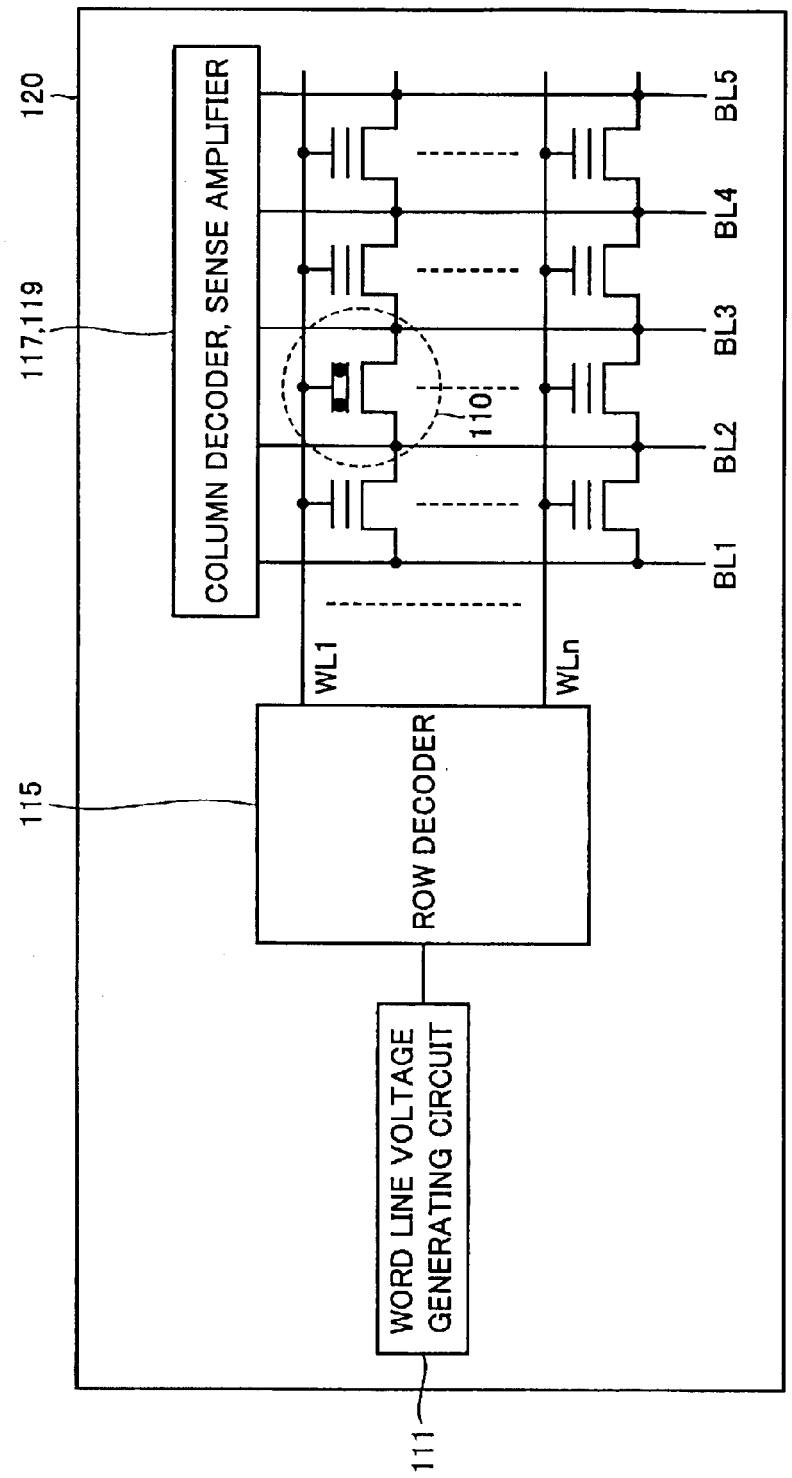
FIG. 13 is a block diagram of a conventional non-volatile semiconductor memory device.
Figure 14:
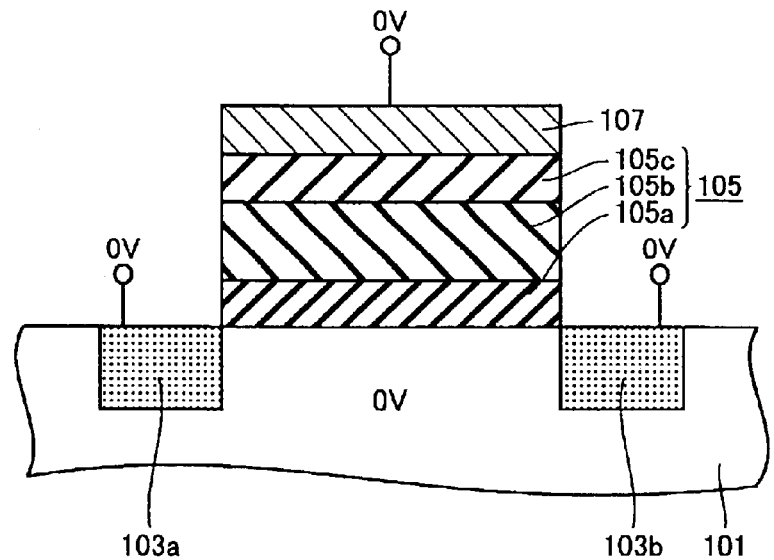
FIG. 14 is a first cross-sectional view representing a write operation of memory cell shown in FIG. 13.
Figure 15:
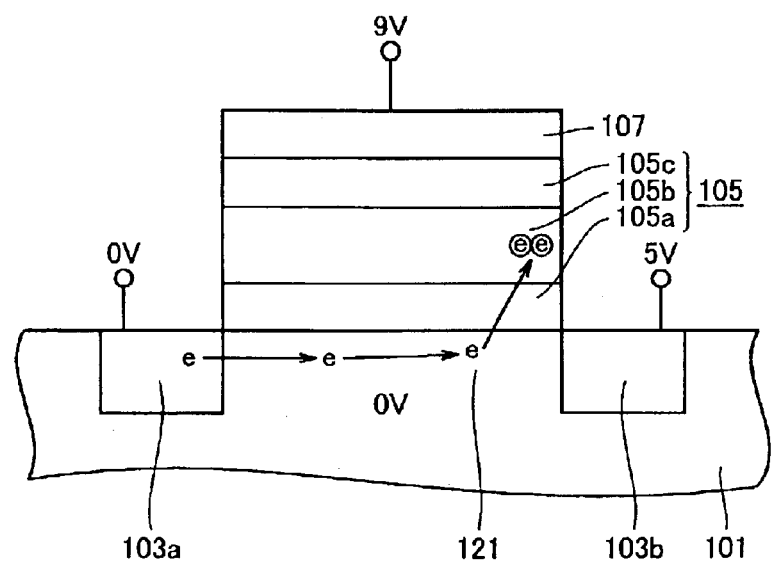
FIG. 15 is a second cross-sectional view representing a write operation of memory cell shown in FIG. 13.
Figure 16:
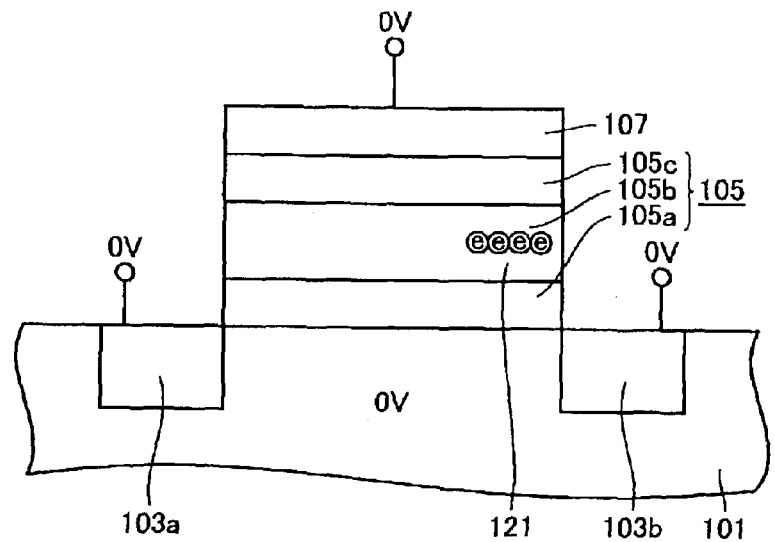
FIG. 16 is a third cross-sectional view representing a write operation of memory cell shown in FIG. 13.
Figure 17:
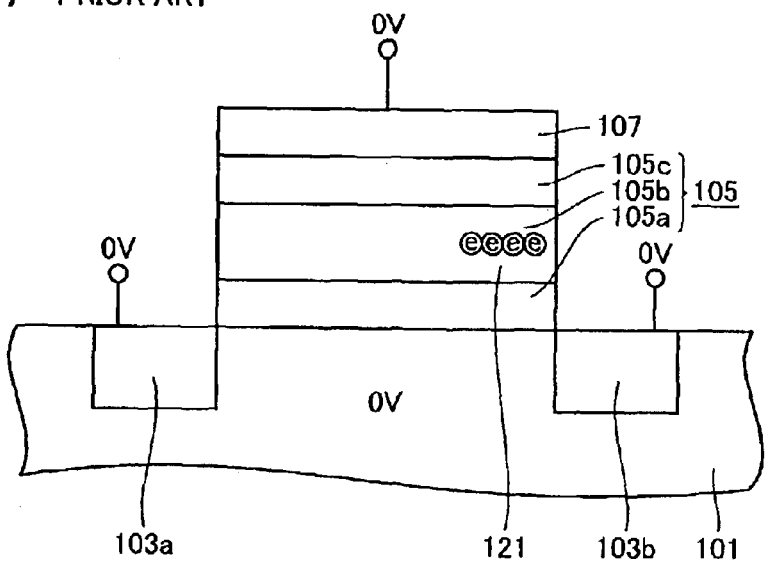
FIG. 17 is a fourth cross-sectional view representing a write operation of memory cell shown in FIG. 13.
Figure 18:
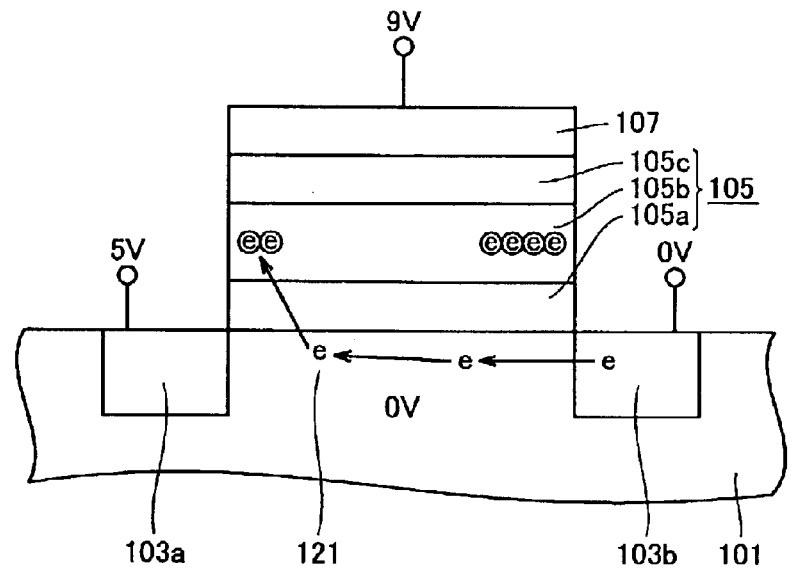
FIG. 18 is a fifth cross-sectional view representing a write operation of memory cell shown in FIG. 13.
Figure 19:
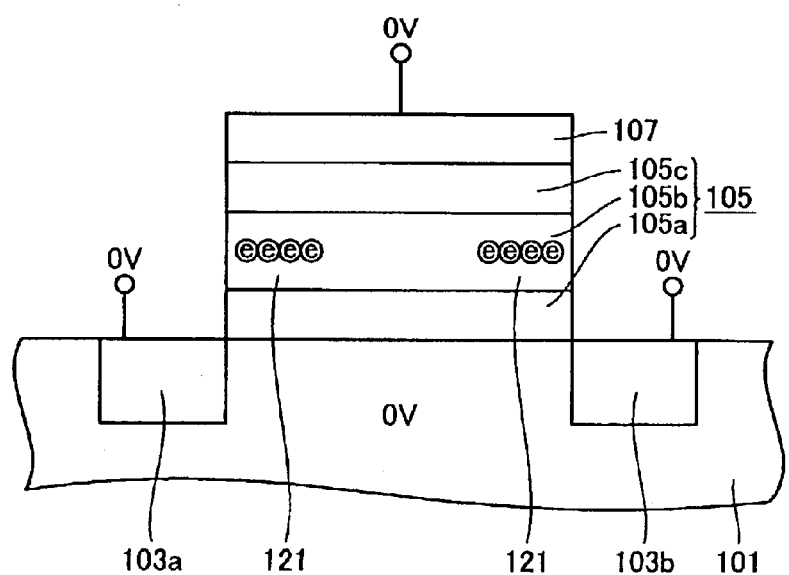
FIG. 19 is a sixth cross-sectional view representing a write operation of memory cell shown in FIG. 13.
Figure 20:
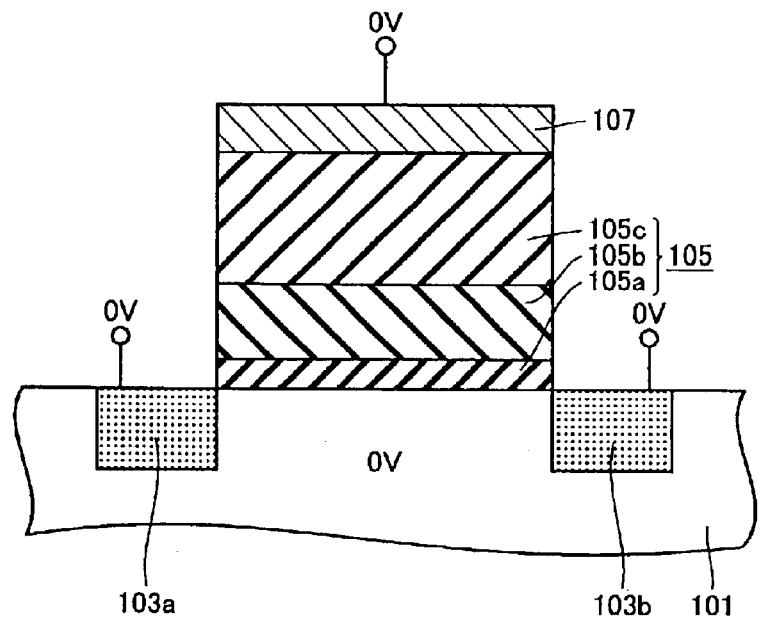
FIG. 20 is a cross-sectional view showing one structure of a memory cell representing problems associated with the conventional non-volatile semiconductor memory device.
Figure 21:
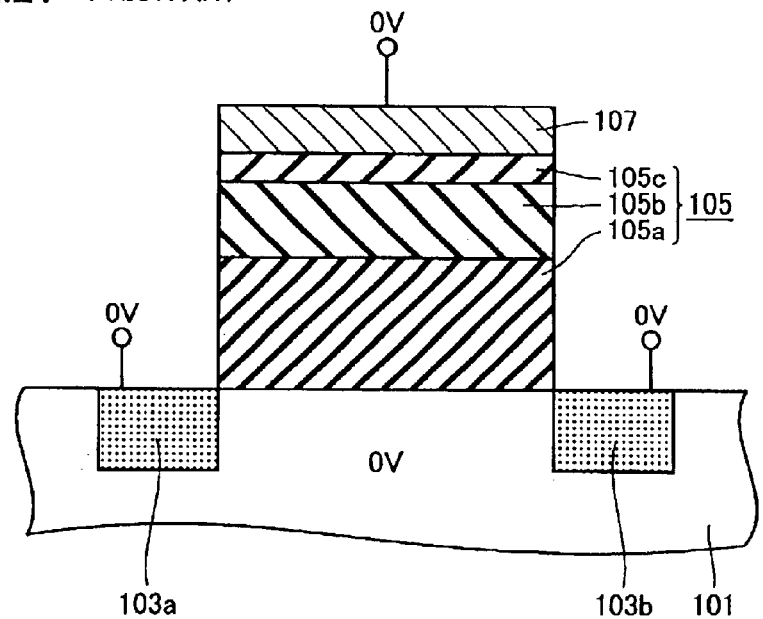
FIG. 21 is a cross-sectional view showing another structure of a memory cell representing problems associated with the conventional non-volatile semiconductor memory device.
Figure 22:
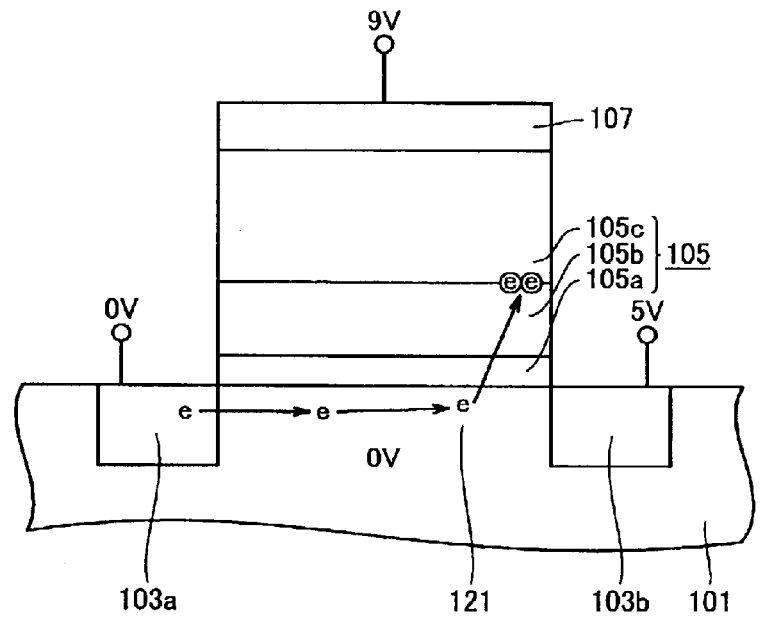
FIG. 22 is a first cross-sectional view representing a write operation in the state shown in FIG. 20.
Figure 23:
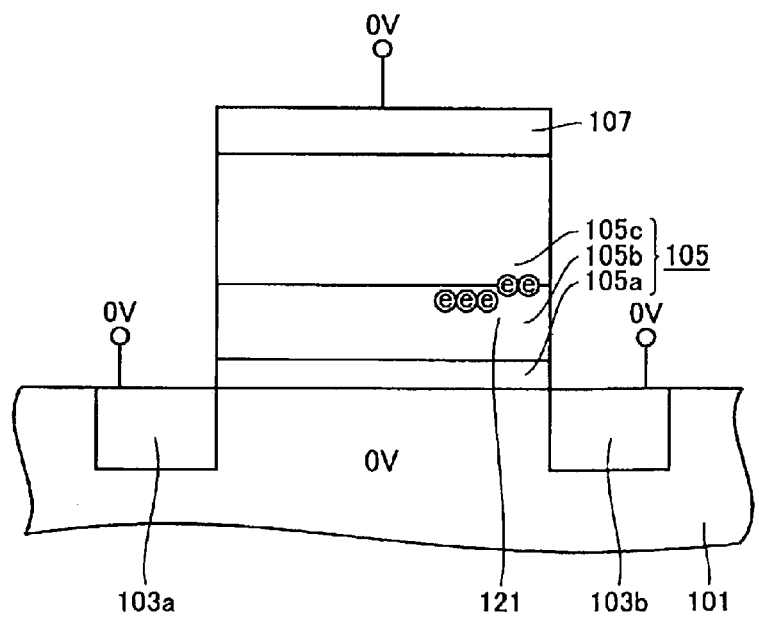
FIG. 23 is a second cross-sectional view representing a write operation in the state shown in FIG. 20.
Figure 24:
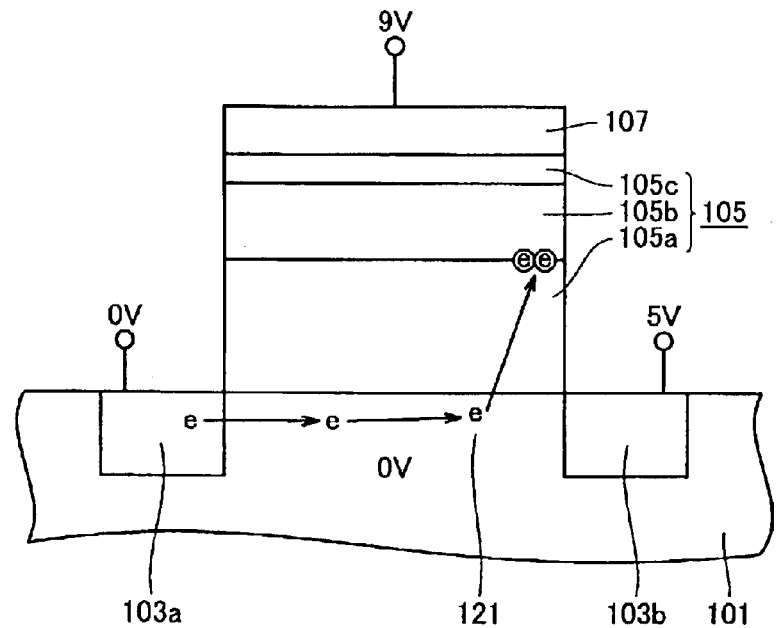
FIG. 24 is a first cross-sectional view representing a write operation in the state shown in FIG. 21.
Figure 25:
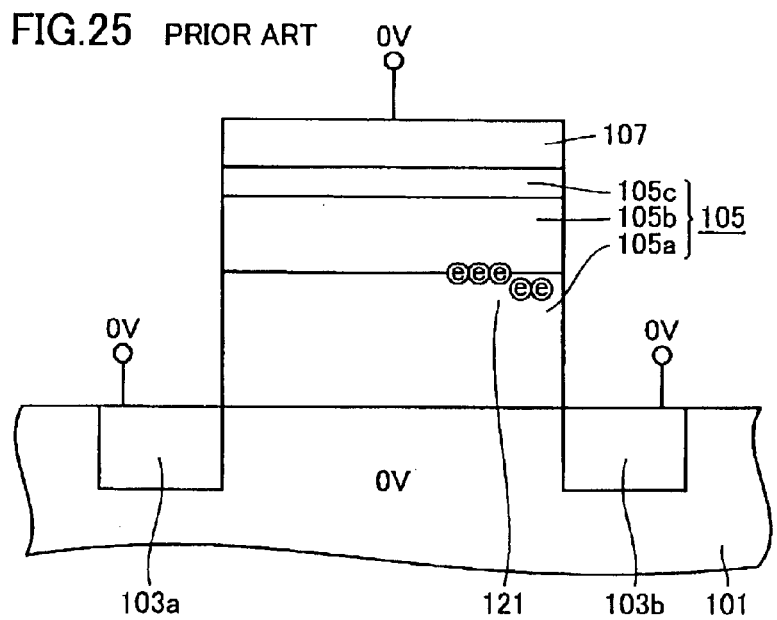
FIG. 25 is a second cross-sectional view representing a write operation in the state shown in FIG. 21.

As shown in FIG. 12, in voltage dividing circuit 22, ten resistors 16a, 16b . . . each having resistance of 1KΩ, 2KΩ, . . . 10KΩ, for example, are connected in parallel. The most suitable set of resistors are selected by voltage selecting circuit 13 from these resistors 16a, 16b . . . connected in parallel, depending on the voltage to be applied to control gate electrode 7. For other resistors, corresponding fuse elements 18a, 18b . . . are disconnected so that they will not contribute to the voltage drop.

Figure 5:
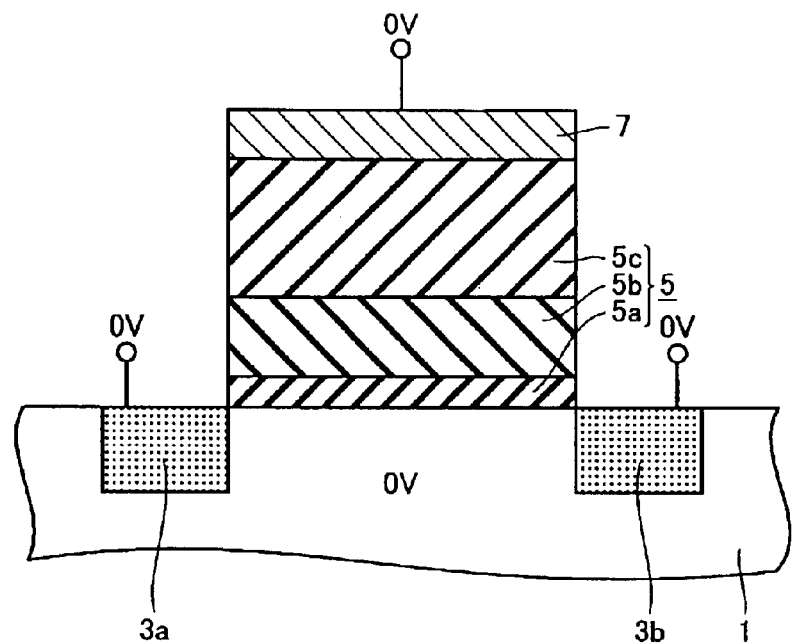
FIG. 5 is a cross-sectional view showing one implementation of memory cell structure according to the first embodiment.

When lower silicon oxide film 5a is formed thinner than upper silicon oxide film 5c in ONO film 5 (see FIG. 5), for example, in the non-volatile semiconductor memory device described above, word line voltage generating circuit A is selected to apply a voltage of 7V uniformly to control gate electrode.

On the other hand, even when lower silicon oxide film 5a is formed thinner than upper silicon oxide film 5c, the difference in thickness between lower silicon oxide film 5a and upper silicon oxide film 5c may be small.

In the non-volatile semiconductor memory device, when the difference in thickness between films are thus relatively small, resistors 16a, 16b . . . of voltage dividing circuit 22 are pre-selected so that prescribed voltage higher than 7V and lower than the normal voltage of 9V can be applied.

Similarly, when upper silicon oxide film 5c is formed thinner than lower silicon oxide film 5a with a relatively small difference in thickness, resistors 16a, 16b . . . of voltage dividing circuit 22 are pre-selected so that prescribed voltage lower than 11V and higher than 9V may be applied.

Accordingly, by selecting resistors 16a, 16b . . . of resistor circuit 16 depending on the thickness of silicon oxide films 5a, 5c of ONO film 5, optimal voltage may accurately be preset, to ensure that electrons are trapped approximately at the center of silicon nitride film 5b in the direction of thickness in a write operation.

By applying the voltage thus set to control electrode 7 in a write operation, it is ensured that electrons as information are trapped and retained approximately at the center of silicon nitride film 5b in the direction of thickness. As a result, memory retaining characteristics are further improved and reliability of the non-volatile semiconductor memory device can be improved.

Though in the above embodiments, silicon oxide films 5a and 5c of ONO film 5 which vary in thickness are described as an example, the present invention is not limited thereto.

It is also possible, for example, to reduce the voltage to be applied to the control gate electrode, by intentionally setting the upper silicon oxide film thinner than the lower silicon oxide film of the ONO film to perform write operation with a voltage (7V) lower than normal voltage (9V).

Additionally, a different plurality of power source voltages are employed in a system LSI in which semiconductor devices with different functionality are mounted on a single chip. When the non-volatile semiconductor memory device of the present invention is mounted on such a system LSI, by intentionally changing the relationship between the thickness of upper silicon oxide film and that of lower silicon oxide film, these power source voltages may be used for a voltage to be applied to the control gate electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising: a memory cell including a pair of impurity regions formed spaced apart from each other on a main surface of a semiconductor substrate, a first insulating film formed on a region between said pair of impurity regions on said semiconductor substrate, a second insulating film formed on said first insulating film for storing charges as information, a third insulating film formed on said second insulating film, and an electrode portion formed on said third insulating film for controlling shift of charges relative to said second insulating film; and a voltage applying circuit supplying to said electrode portion a prescribed voltage, in an information write operation, for storing charges approximately at the center of said second insulating film in a direction of thickness; wherein said voltage applying circuit includes a voltage selecting circuit pre-selecting said prescribed voltage depending on the relationship between thickness of said first insulating film and thickness of said third insulating film.

2. The non-volatile semiconductor memory device according to claim 1, wherein said voltage applying circuit further includes a first voltage generating circuit generating a first voltage to be selected when said first insulating film and said third insulating film have substantially the same thickness;
a second voltage generating circuit generating a second voltage lower than said first voltage; and
a third voltage generating circuit generating a third voltage higher than said first voltage; wherein
said voltage selecting circuit selects any one of said first, second, third voltages.

3. The non-volatile semiconductor memory device according to claim 2, wherein
said second voltage is set when said first insulating film is thinner than said third insulating film.

4. The non-volatile semiconductor memory device according to claim 2, wherein
said third voltage is set when said third insulating film is thinner than said first insulating film.

5. The non-volatile semiconductor memory device according to claim 1, wherein
said voltage applying circuit includes
a first voltage generating circuit generating one voltage; and
a voltage dividing circuit generating said prescribed voltage from said one voltage through resistance division; wherein
in said voltage selecting circuit, voltage division by said voltage dividing circuit is adjusted, and any one of said first voltage to be applied to said electrode portion when said first insulating film and said third insulating film have substantially the same thickness, a second voltage lower than said first voltage, and a third voltage higher than said first voltage is selected.

* * * * *